United States Patent
Erez

(10) Patent No.: US 9,489,146 B2
(45) Date of Patent: Nov. 8, 2016

(54) MEMORY SYSTEM AND METHOD FOR SELECTING MEMORY DIES TO PERFORM MEMORY ACCESS OPERATIONS IN BASED ON MEMORY DIE TEMPERATURES

(71) Applicant: SanDisk Technologies Inc., Plano, TX (US)

(72) Inventor: Eran Erez, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 14 days.

(21) Appl. No.: 14/565,125

(22) Filed: Dec. 9, 2014

(65) Prior Publication Data

US 2016/0162219 A1 Jun. 9, 2016

(51) Int. Cl.
*G11C 7/04* (2006.01)
*G06F 3/06* (2006.01)

(52) U.S. Cl.
CPC ........... *G06F 3/0653* (2013.01); *G06F 3/0617* (2013.01); *G06F 3/0688* (2013.01)

(58) Field of Classification Search
USPC ........................................... 365/211, 230.03
See application file for complete search history.

(56) References Cited

U.S. PATENT DOCUMENTS

| 7,458,000 | B2* | 11/2008 | Gorman | ................. | G11C 29/16 714/733 |
|---|---|---|---|---|---|
| 7,965,571 | B2 | 6/2011 | Jeong et al. | | |
| 8,331,183 | B2* | 12/2012 | Lee | ........................... | G11C 7/04 365/163 |
| 2012/0224425 | A1* | 9/2012 | Fai | ....................... | G11C 11/5642 365/185.09 |
| 2012/0331207 | A1 | 12/2012 | Lassa et al. | | |
| 2013/0295697 | A1* | 11/2013 | Hanan | ................. | G01R 31/2884 438/12 |
| 2014/0101371 | A1* | 4/2014 | Nguyen | ................. | G06F 3/0616 711/103 |
| 2014/0241033 | A1* | 8/2014 | Gaertner | ............ | G11C 13/0002 365/148 |
| 2014/0281311 | A1* | 9/2014 | Walker | .................. | G06F 3/0631 711/162 |

* cited by examiner

*Primary Examiner* — Vu Le

(74) *Attorney, Agent, or Firm* — Brinks Gilson & Lione

(57) ABSTRACT

A memory system and method are provided for selecting memory dies for memory access operations based on memory die temperatures. The memory system has a plurality of memory dies, where each memory die has its own temperature sensor. In one embodiment, the memory system selects which memory dies to perform memory access operations in based on the temperatures of the memory dies. In another embodiment, a controller of the memory system selects which memory dies to thermal throttle memory access operations in based on the detected temperatures. In yet another embodiment, a temperature-aware media management layer module of the memory 1 system routes a memory access operation from a first memory die to a second memory die based on the temperatures of the memory dies.

39 Claims, 9 Drawing Sheets

Soft Temperature Weighting

| Die | Temperature | Weight |
|---|---|---|
| 1 | 56c | 8 |
| 2 | 35c | 10 |
| 3 | 85c | 0 |
| . | | |
| . | | |
| N-1 | 92c | 0 |
| N | 62c | 6 |

10 = most recommended
1 = least recommended
0 = prohibited
Critical temperature threshold = 80c

FIG. 5

Hard Temperature Weighting

| Die | Temperature | Weight |
|---|---|---|
| 1 | 56c | 1 |
| 2 | 35c | 1 |
| 3 | 85c | 0 |
| . | | |
| . | | |
| N-1 | 92c | 0 |
| N | 62c | 1 |

1 = allowed
0 = prohibited
Critical temperature threshold = 80c

FIG. 6

Average Temperature Statistics

| Die | Temperature |
|---|---|
| 1 | 42c |
| 2 | 34c |
| 3 | 55c |
| . | |
| . | |
| N-1 | 38c |
| N | 24c |

FIG. 7

MEMORY SYSTEM AND METHOD FOR SELECTING MEMORY DIES TO PERFORM MEMORY ACCESS OPERATIONS IN BASED ON MEMORY DIE TEMPERATURES

BACKGROUND

Memory systems, such as solid-state drives, can comprise a plurality of non-volatile memory dies (e.g., NAND memory dies), which can be accessed in parallel to increase write and/or read performance of the memory system. However, the memory dies have a maximum temperature limit, and when the temperature of a memory die exceeds its maximum temperature limit, charge in the transistors of the memory die can leak out, creating data retention issues. The temperature of a memory die can be sensed by an external temperature sensor placed in the vicinity of the memory die that is expected to be the hottest (e.g., the memory die that is located nearest to the DRAM). When the memory die nears its temperature limit (e.g., 90 C.), the memory system can perform thermal throttling to slow down the entire memory system by limiting the number of memory accesses (writes and/or reads) per time unit for all the memory dies, which limits the amount of dissipated power. By basing the throttling decision off of what is expected to be the hottest memory die, the memory system can help ensure that none of the memory dies will overheat.

OVERVIEW

Embodiments of the present invention are defined by the claims, and nothing in this section should be taken as a limitation on those claims.

By way of introduction, the below embodiments relate to a memory system and method for selecting memory dies to perform memory access operations in based on memory die temperatures. The memory system has a plurality of memory dies, where each memory die has its own temperature sensor. In one embodiment, the memory system monitors temperatures of the memory dies sensed by the temperature sensors and selects which memory dies to perform memory access operations in based on the temperatures of the memory dies. In another embodiment, a controller of the memory system detects temperatures of the memory dies sensed by the temperature sensors, selects which memory dies to thermal throttle memory access operations in based on the detected temperatures, and thermal throttles memory access operations only in the selected memory dies. In yet another embodiment, a temperature-aware media management layer module of the memory system receives temperature information from the temperature sensors of the plurality of memory dies and routes a memory access operation from a first memory die to a second memory die based on the received temperatures.

Other embodiments are possible, and each of the embodiments can be used alone or together in combination. Accordingly, various embodiments will now be described with reference to the attached drawings.

BRIEF DESCRIPTION OF THE DRAWINGS

FIG. 5 is a soft temperature weighing chart of an embodiment.

FIG. 6 is a hard temperature weighing chart of an embodiment.

FIG. 7 is an average temperature statistics chart of an embodiment.

DETAILED DESCRIPTION OF THE PRESENTLY PREFERRED EMBODIMENTS

As mentioned in the background section above, memory systems with a plurality of memory dies need to ensure that the maximum temperature limit of the memory dies is not exceeded. Typically, a temperature sensor is placed near what is expected to be the hottest memory die, and, when that memory die nears its temperature limit, the memory system enters into a power throttling mode, which limits the number of memory access operations (e.g., writes and/or reads) performed in all the memory dies. While this approach ensures that the maximum temperature limit of any memory die is not exceeded, thermal throttling based on the hottest memory die may not lead to optimal performance of the memory system, as the memory dies that are cooler than the hottest memory die can endure more write and/or read accesses before reaching the temperature limit. Accordingly, the prior approach described above may result in suboptimal use of the memory system.

The following embodiments describe techniques that can address this situation. Before turning to these techniques, the following paragraphs describe exemplary memory systems that can be used with these embodiments. It should be understood that these are merely examples and other designs can be used.

Figure 1A:
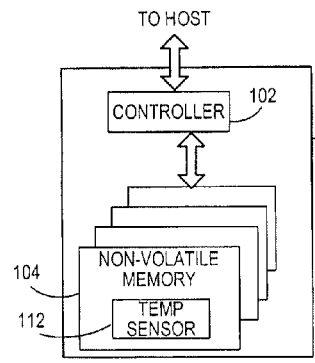
FIG. 1A is a block diagram of a non-volatile memory system of an embodiment.

Turning now to the drawings, FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. In one embodiment, each of the memory dies 104 has its own temperature sensor 112. As will be explained in more detail below, the temperature sensor 112 can be integrated with (built-in) the memory die 104, or the temperature sensor 112 can be a separate component on or near the memory die 104. The phrase "the memory die has its own temperature sensor" is intended to refer to either situation.

Controller 102 interfaces with a host system and transmits command sequences for read, program, and erase operations to non-volatile memory die 104. The controller 102 (which may be a flash memory controller) can take the form of processing circuitry, a microprocessor or processor, and a computer-readable medium that stores computer-readable program code (e.g., firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
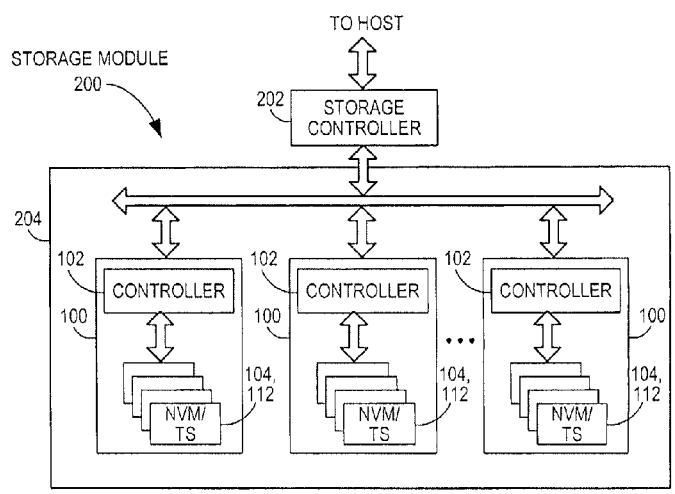
FIG. 1B is a block diagram illustrating an exemplary storage module of an embodiment.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
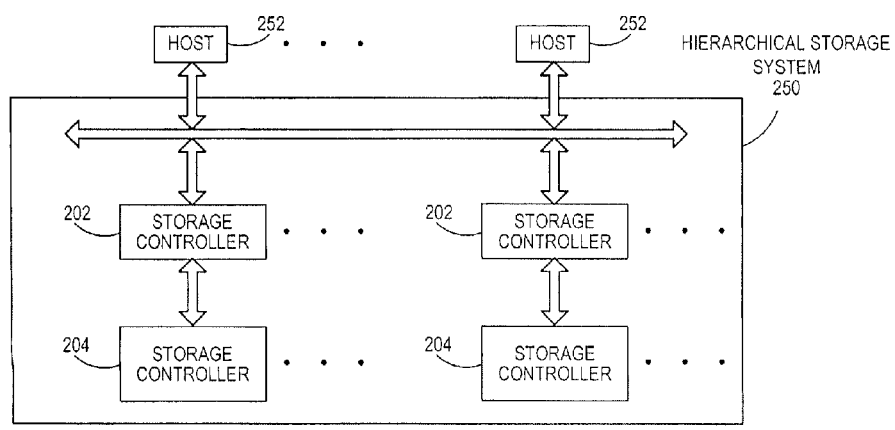
FIG. 1C is a block diagram illustrating a hierarchical storage system of an embodiment.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe serial attached SCSI (SAS) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
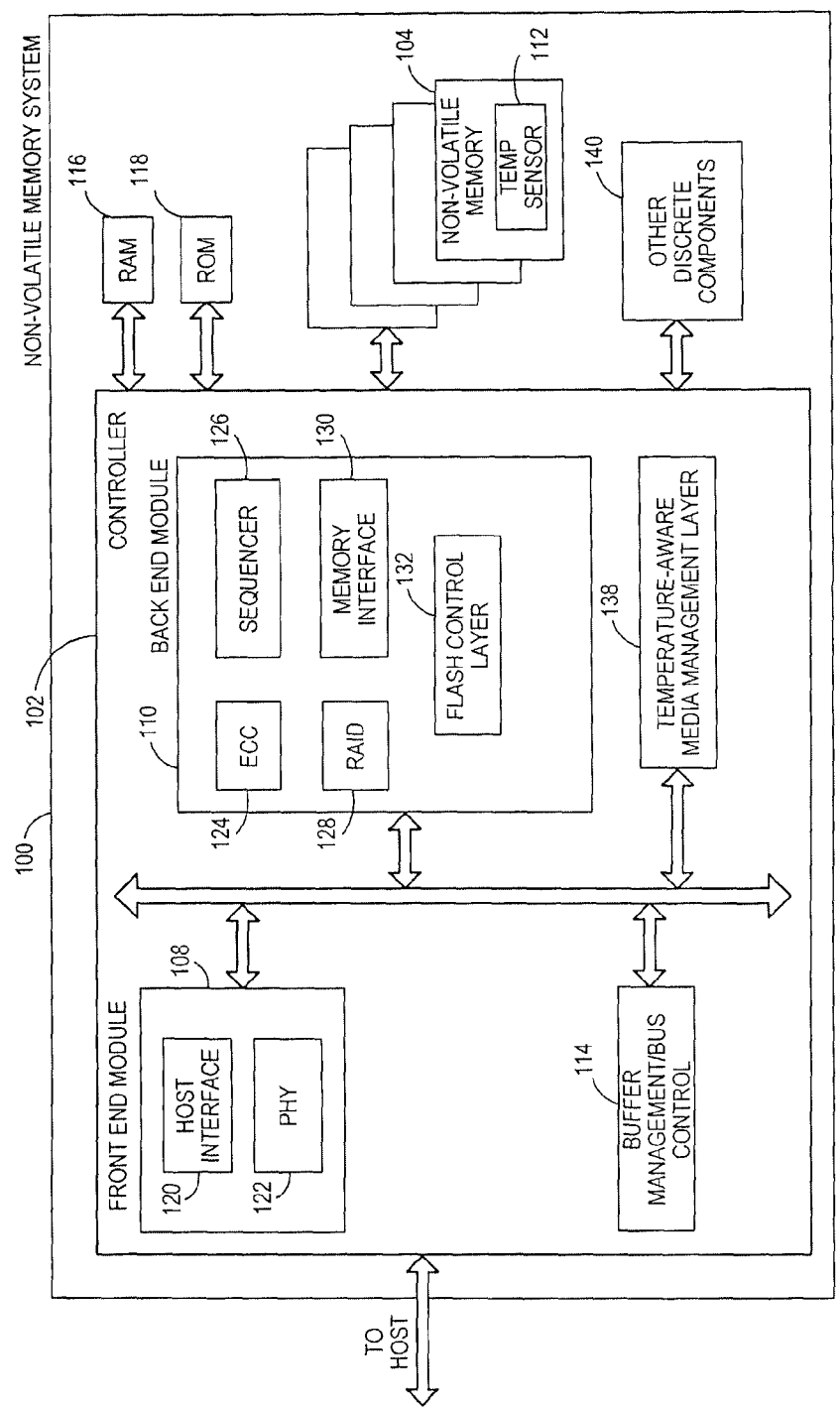
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 (e.g., DRAM) and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data received from the host, and decodes and error corrects the data read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include a temperature-aware media management layer module 138, which performs memory die selection and memory access (e.g., write and/or read) and other operations (e.g., garbage collection and/or wear leveling) on the selected memory die(s) 104. As will be described in more detail below, the media management layer module 138 in these embodiments is "temperature aware" because it can take into account the temperature of one or more of the memory dies 104 in determining which memory die(s) 104 to select and which actions to take on the selected memory die(s) 104. By using temperature sensors and the temperature-aware media management layer module 138, each memory die can have its temperature individually sensed and tracked, and, when one of the memory dies reaches its temperature limit, memory accesses (e.g., new write and/or read commands) that would normally be routed to that memory die can instead be routed to a colder memory die, effectively individualizing thermal throttling on a per-memory-die basis.

System 100 also includes other discrete components 140, such as external electrical interfaces, external RAM, resistors, capacitors, or other components that may interface with controller 102. In alternative embodiments, one or more of the physical layer interface 122, RAID module 128, and the buffer management/bus controller 114 are optional components that are not necessary in the controller 102.

Figure 2B:
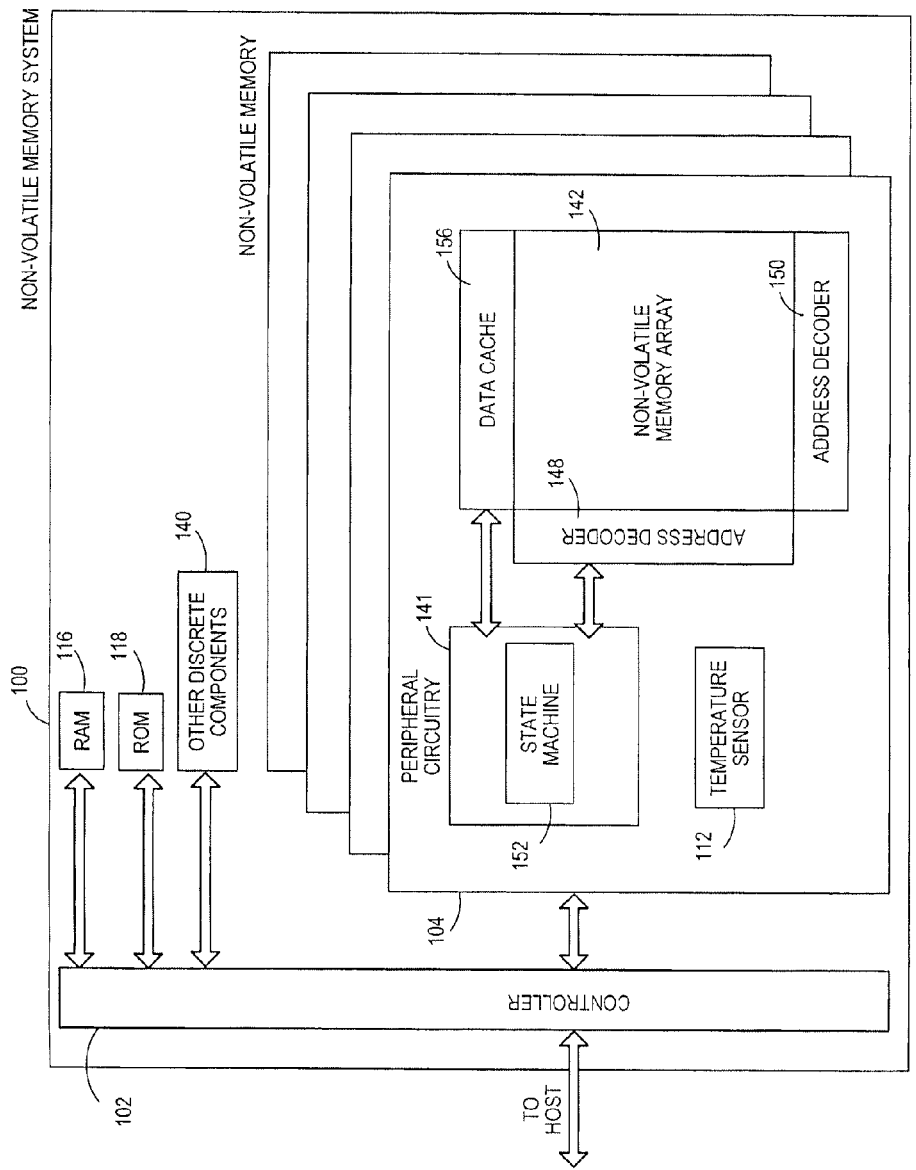
FIG. 2B is a block diagram illustrating exemplary components of the non-volatile memory of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

In these embodiments, each memory die has its own temperature sensor 112. As explained above, the temperature sensor 112 can be integrated with (built-in) the memory die 104, or the temperature sensor 112 can be a separate component on or near the memory die 104. As used herein, a memory die "has its own temperature sensor" either if the memory die 104 has an on-chip temperature sensor or if the memory die 104 has an external temperature sensor (i.e., "has its own temperature sensor" is not intended to only refer to memory dies with integrated temperature sensors). Also, any suitable type of temperature sensor can be used. For example, the temperature sensor 112 can be a component in an integrated circuit that monitors the characteristics of a bipolar junction transistor in a band-gap circuit, as the base-emitter voltage of the bipolar junction transistor varies according to temperature. Of course, this is just one example, and other types of temperature sensors (now available or later developed) can be used.

Memory die temperature can vary for different reasons, and different memory dies in a memory system can have different temperatures for a variety of reasons. For example, some components in a memory system, such as DRAM (RAM 116) or a controller 102 (see FIGS. 2A and 2B), are known to radiate heat. So, memory dies physically located near such components can be expected to be warmer than memory dies that are located farther away from such components. As another example, in "multi-tier" memory systems (e.g., memory systems with both single-level cell (SLC) memory dies and multi-level cell (MLC) memory dies), the SLC memory dies are likely to be written to more frequently because of their higher performance, and this increased write activity will cause the SLC memory dies to be warmer than the MLC memory dies. Write and read activity can also cause the temperature of specific memory die(s) to increase, so the memory dies that are accessed more often will be hotter than the memory dies that are accessed less frequently.

As mentioned above, memory systems with a plurality of memory dies often need to ensure that the maximum temperature limit of the memory dies is not exceeded. In prior memory systems, when any memory die in the memory system nears its temperature limit (e.g., the memory die nearest to the controller), the memory system thermal throttles write and/or read operations to all of the memory dies. As used herein, "thermal throttle operations" refers to limiting the number of writes and/or read accesses performed to a memory die to some smaller number than normal (e.g., 50%, 25%, etc.) or to no memory access at all. While the all-or-nothing approach of prior systems ensures that the maximum temperature limit is not exceeded for any of the memory dies, thermal throttling based on the hottest memory die may not lead to optimal performance of the memory system. As explained above, temperatures across multiple memory dies can vary for a variety of reasons, so even if there are one or more memory dies that are approaching the maximum temperature limit, other memory dies in the system may not be. Thus, limiting or preventing memory accesses to all of the memory dies means that the colder memory dies are underutilized, as they can endure more memory accesses and do not need to be thermally throttled.

To address this situation and increase performance of the memory system 100, instead of thermally throttling all or none of the memory dies 104 as in the prior systems, the memory system 100 in one embodiment monitors temperatures of the memory dies 104 (as sensed by the temperature sensors 112) and selects which memory dies to perform memory access operations in based on the temperatures of the memory dies. In this way, the memory system 100 can perform memory access operations only in some memory dies (e.g., colder memory dies) while thermally throttling other memory dies (e.g., memory dies that are reaching the maximum temperature limit). It should be noted that the memory access operations in the selected memory dies can be performed in a serial or parallel manner. As used herein, "memory access operations" can refer to write operations, read operations, or a combination of write and read operations. While some of the examples below may refer to write operations, it should be understood that they can also apply to read operations. Also, in some embodiments, when write (read) operations are thermally throttled in memory die(s), read (write) operations may still be able to be performed in those memory dies, if read (write) operations do not have a significant thermal cost.

Figure 3:
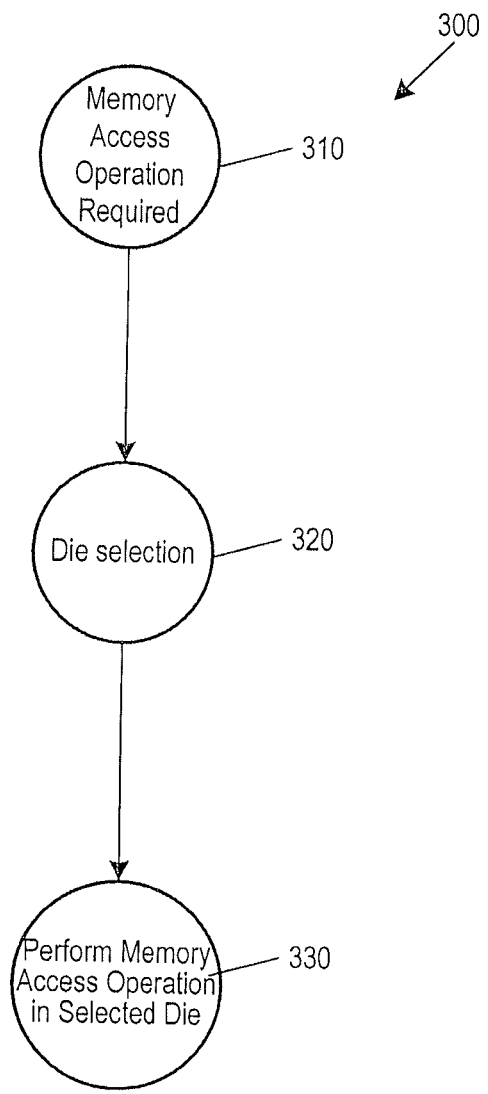
FIG. 3 is a flow chart of a method of an embodiment for selecting a memory die.

While the controller 102 or other component of the memory system 100 can perform this memory die selection technique, in one embodiment, the temperature-aware media management layer module 138 is used. With reference to the flow chart 300 in FIG. 3, when a memory access operation is required in the memory dies 104 (act 310), the media management layer module 138 selects which die to perform the memory access operation in (act 320) and the memory access operation is then performed in the selected memory die (act 330). A memory access operation can be required, for example, if a host (e.g., a computer, a mobile phone, a tablet, a digital media player, a game device, a personal digital assistant (PDA), or a book reader) is sending a write and/or read command to the memory system 100 or if the memory system 100 is conducting an internal operation that required data to be written to and/or read from the memory dies 104.

Figure 4:
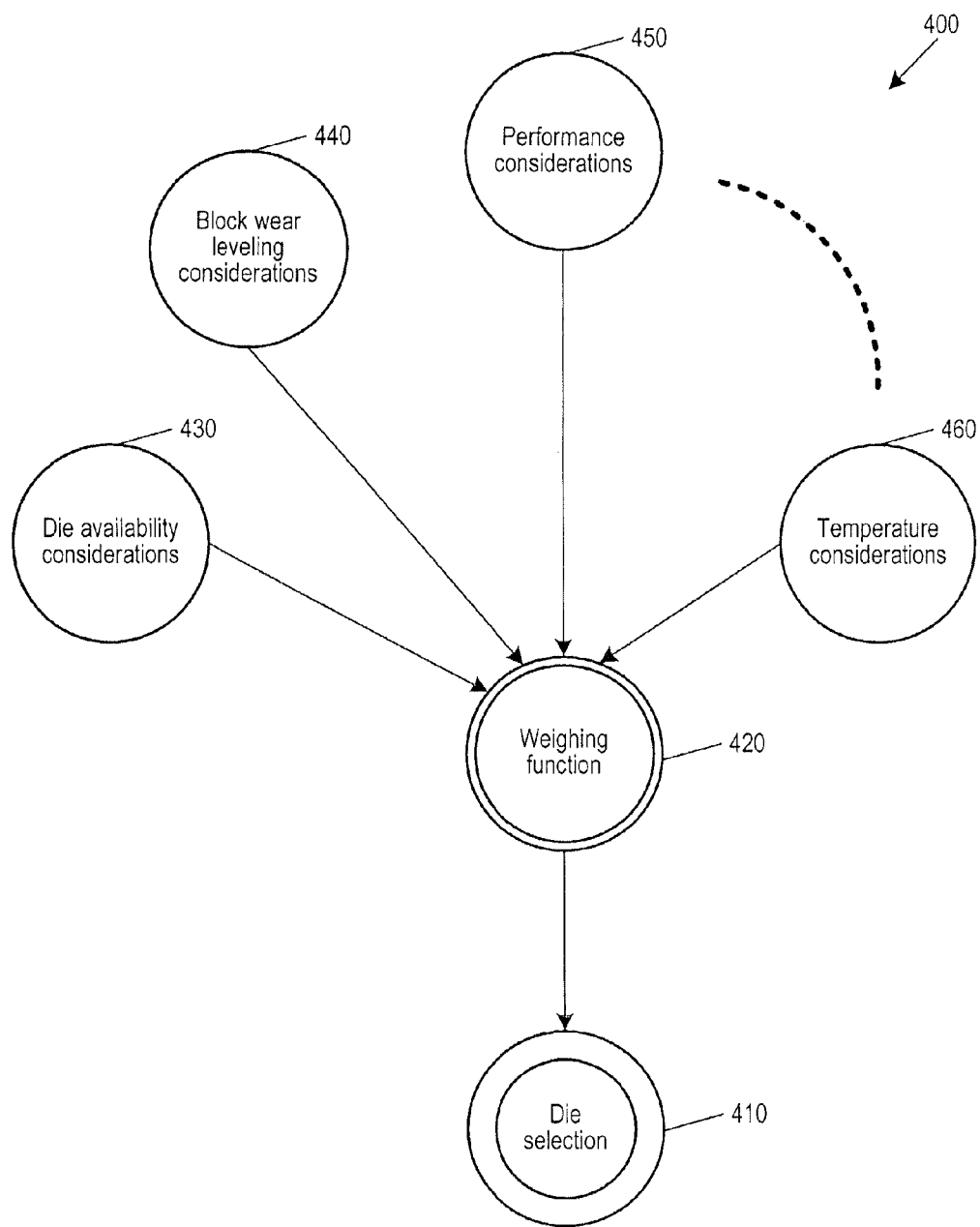
FIG. 4 is a flow chart of a method of an embodiment for weighing various considerations in selecting a memory die.

As shown in the flow chart of FIG. 4, a media management layer module typically considers and weighs various factors in making a die selection 410. These factors include, but are not limited to, die availability 430 (e.g., if one die is being occupied by some operation, find another die that is available), block wear leveling 440 (e.g., to attempt to maintain a uniform program/erase cycle count on all the memory dies), and performance 450 (the number of writes per time unit). However, in this embodiment, the media management layer module 138 is temperature aware, meaning that instead of or in addition to these or other considerations, the media management layer module 138 also factors in temperature consideration 460 of the memory dies.

The controller 102 can use a weighing function 420 to weigh these various different factors and specific incidents of individual factors. For example, in some situations, the memory die to choose for performance reasons may also be the hottest memory die, and the weighing function 420 can specify which factor has higher priority. As another example, in considering temperature, the controller 102 can weight different temperature readings in making a die selection decision. For example, as shown in FIG. 5, different weights can be assigned to dies of different temperatures, so that a weight of 10 (most recommended) is assigned the coldest die, a weight of 1 (least recommended) is assigned to the warmest die, and a weight of 0 (prohibited) is assigned to a die that has reached the critical temperature threshold. Instead of a spectrum of weights (e.g., 0 to 10, as in FIG. 5), a binary weighing system can be used (see FIG. 6), where only 1's (allowed) and 0's (prohibited) are assigned. As yet another alternative, instead of a temperature at a singular moment in time, average temperatures of each memory die over time can be used (FIG. 7). Other weight techniques can be used.

Because the memory system 100 selects which memory dies to perform memory access operations in based on the temperatures of the memory dies, the memory system 100 can select which memory dies to thermal throttle based on the detected temperatures. In this way, the memory system 100 can route a memory access operation from one or more memory dies that are too hot to one or more memory dies that are cooler (e.g., a write operation intended for a first memory die can be routed to a second memory die). Similarly, the memory system 100 can direct a read operation to one or more memory dies that are cooler if the requested data is stored on more than one memory die (e.g., a read operation for data stored on multiple dies can be directed to the cooler memory). By thermal throttling memory access operations only in the selected memory dies, this embodiment avoids the all-or-nothing approach in prior system where all the memory dies are thermally throttled just because a subset (e.g., one) of memory dies needs to be. This improves performance of the memory system 100 because memory access operations can continue to be performed in some memory dies (e.g., colder memory dies) even while other memory dies (e.g., memory dies that are reaching the maximum temperature limit) are thermally throttled. When the hot memory dies have cooled down, they can be used for memory access operations again.

One issue that can come up with routing write operations from warmer dies to cooler dies is that the cooler dies may develop overprovisioning issues.

Overprovisioning refers to providing more storage capacity in a memory die than is made visible to a host as available storage. For example, in a memory system that has 256 GB of physical storage capacity, the memory system may only tell the host that 250 GB of logical addresses are available for storage. The extra 6 GB are overprovisioned to ensure that write and other operations can be performed as intended. For example, with NAND memory, data is written in pages but erased in blocks. So, if a block contains valid data, the valid data needs to be moved to a temporary space, so the block can be erased. The valid data can later be moved from that temporary space to the freshly-erased block. Overprovisioning ensures that the temporary space is available in the memory.

The amount of capacity that is overprovisioned can change over time, and routing write operations from warmer memory dies to colder memory dies can result in less overprovisioning than desired/needed in the colder memory dies. In contrast, the warmer memory dies from which the write operations are routed may have more overprovisioning than desired/needed. To address this situation, the memory system 100 (e.g., the controller 102 or the temperature-aware media management layer module 138) can perform temperature-based data swapping to relocate "hot" and "cold" data among the memory dies 104 to help balance the overprovisioning. As used here, "hot data" refers to frequently-written data (e.g., file system data), and "cold data" refers to infrequently-written data (e.g., achieved data). Although the terms "hot" and "cold" are used in these phrases, "hot" and "cold" do not refer to temperature in this context.

Also, hosts may repeatedly access a certain location on the memory dies for read. Such frequently-read locations hold "hot data" (e.g., file system data). The same temperature-based data swapping technique described above can be applied by the memory system 100 to address these "hot data" reads.

Figure 8:
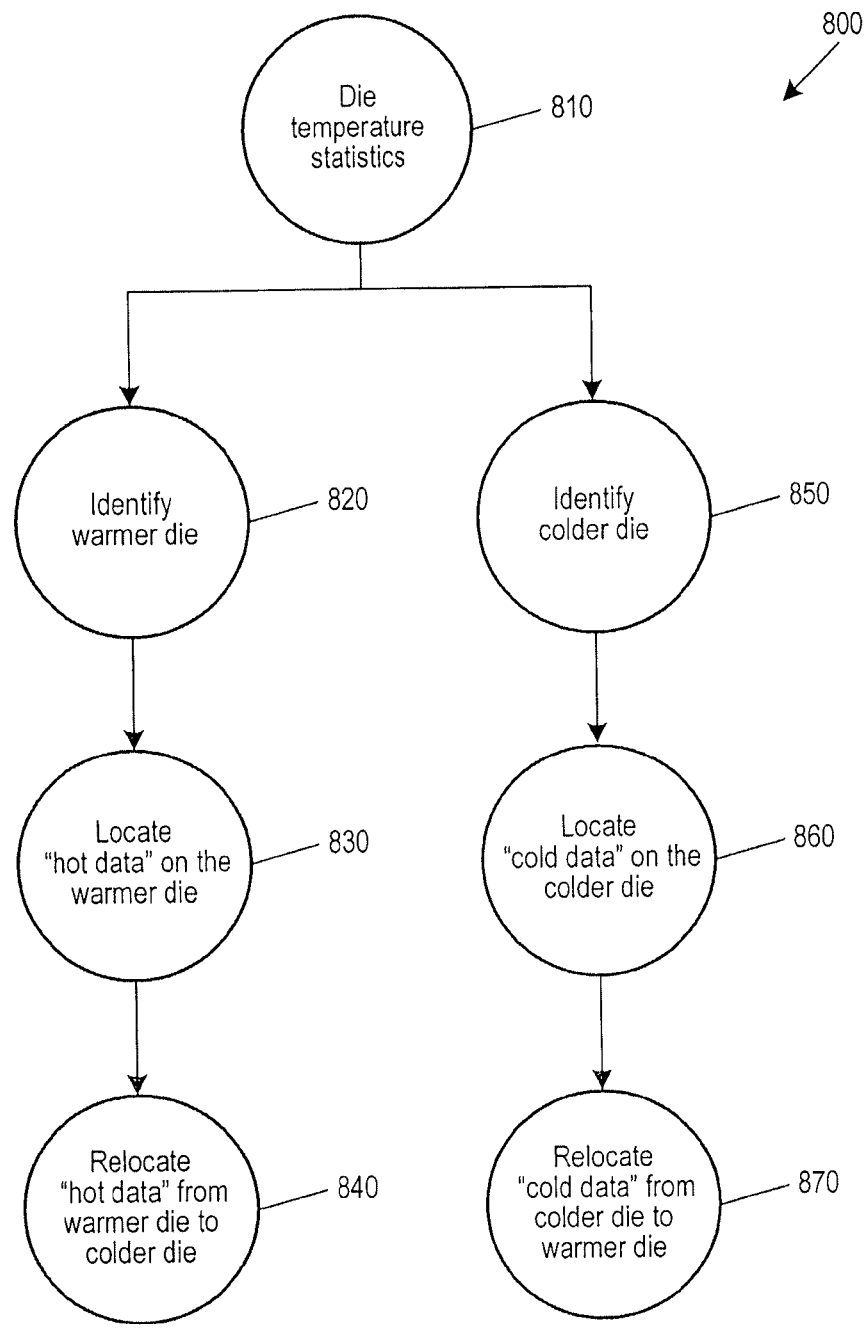
FIG. 8 is a flow chart of a method of an embodiment for temperature-based data swapping.

Returning to the drawings, as shown in the flow chart 800 in FIG. 8, based on die temperature statistics (act 810), the controller 102 can identify a warmer die (act 820), locate hot data on the warmer die (act 830), and relocates the hot data from the warmer die to a colder die (act 840). Similarly, the controller 102 can identify a colder die (act 850), locate cold data on the colder die (act 860), and relocate the cold data from the colder die to the warmer die (act 870). This provides the colder die with more overprovisioning (because there is less data stored in the die) while avoiding increasing the temperature of the warmer die (because the cold data is less likely to be written).

Figure 9:
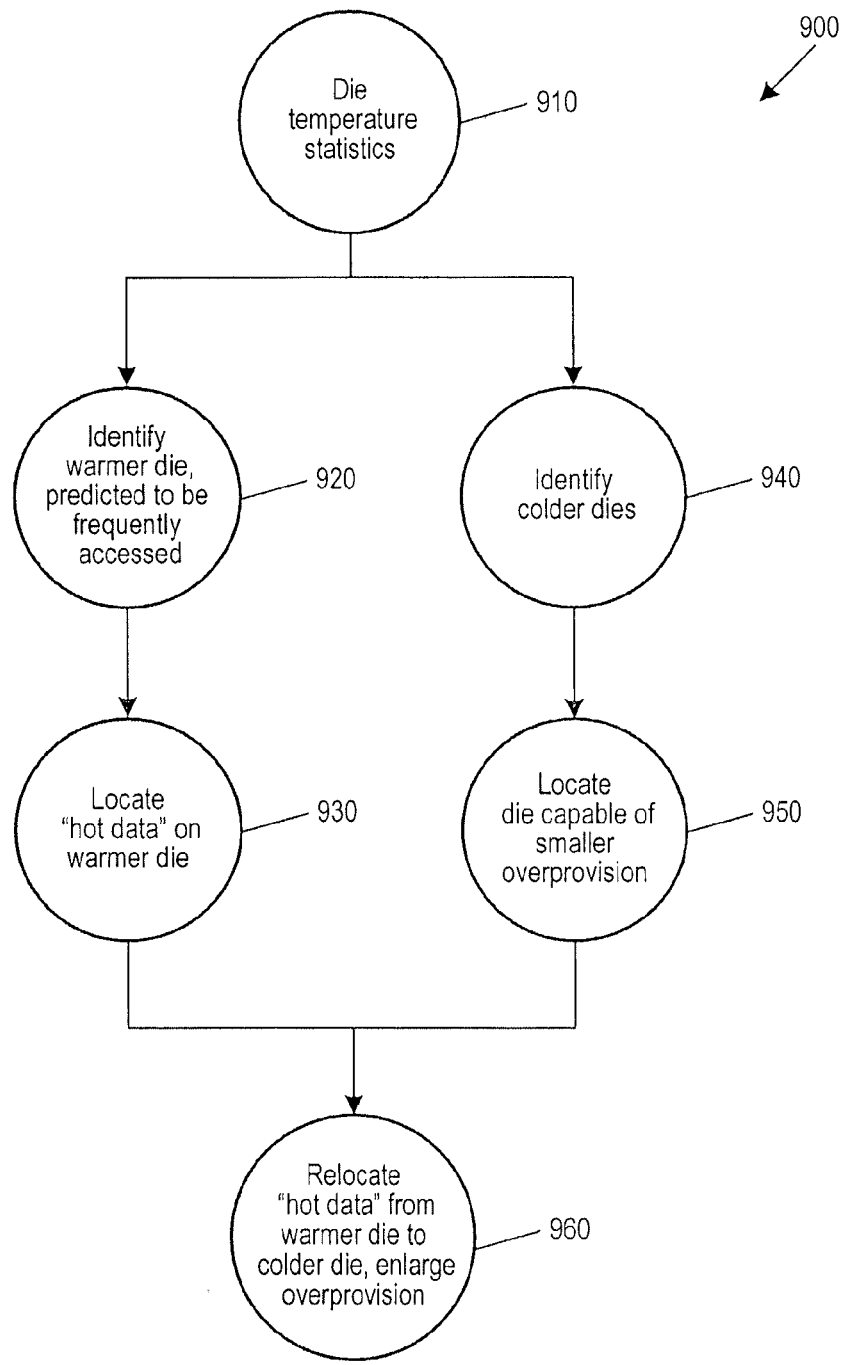
FIG. 9 is a flow chart of a method of an embodiment for temperature-based overprovisioning.

Swapping data between warmer and colder memory dies, as in the flow chart 800 in FIG. 8, is particularly useful in situations where host write and/or read patterns are the primary reason for temperature increases in memory dies. However, in situations where the memory die temperature builds up primarily as a response to the memory die being frequently accessed, the wear pressure on the memory die may need to be relaxed by enlarging the overprovisioning of the warmer memory die. This alternative is shown in the flow chart 900 in FIG. 9. As shown in FIG. 9, based on die temperature statistics (act 910), the controller 102 identifies a warmer die predicted to be frequently accessed (act 920) and locates the hot data on the warmer die (act 930). The controller 102 also identifies colder dies (act 940) and locates a die capable of a smaller overprovision (act 950). The controller 102 then relocates the hot data from the warmer die to the colder die, thereby enlarging the overprovision in the warmer die (act 960).

Figure 10:
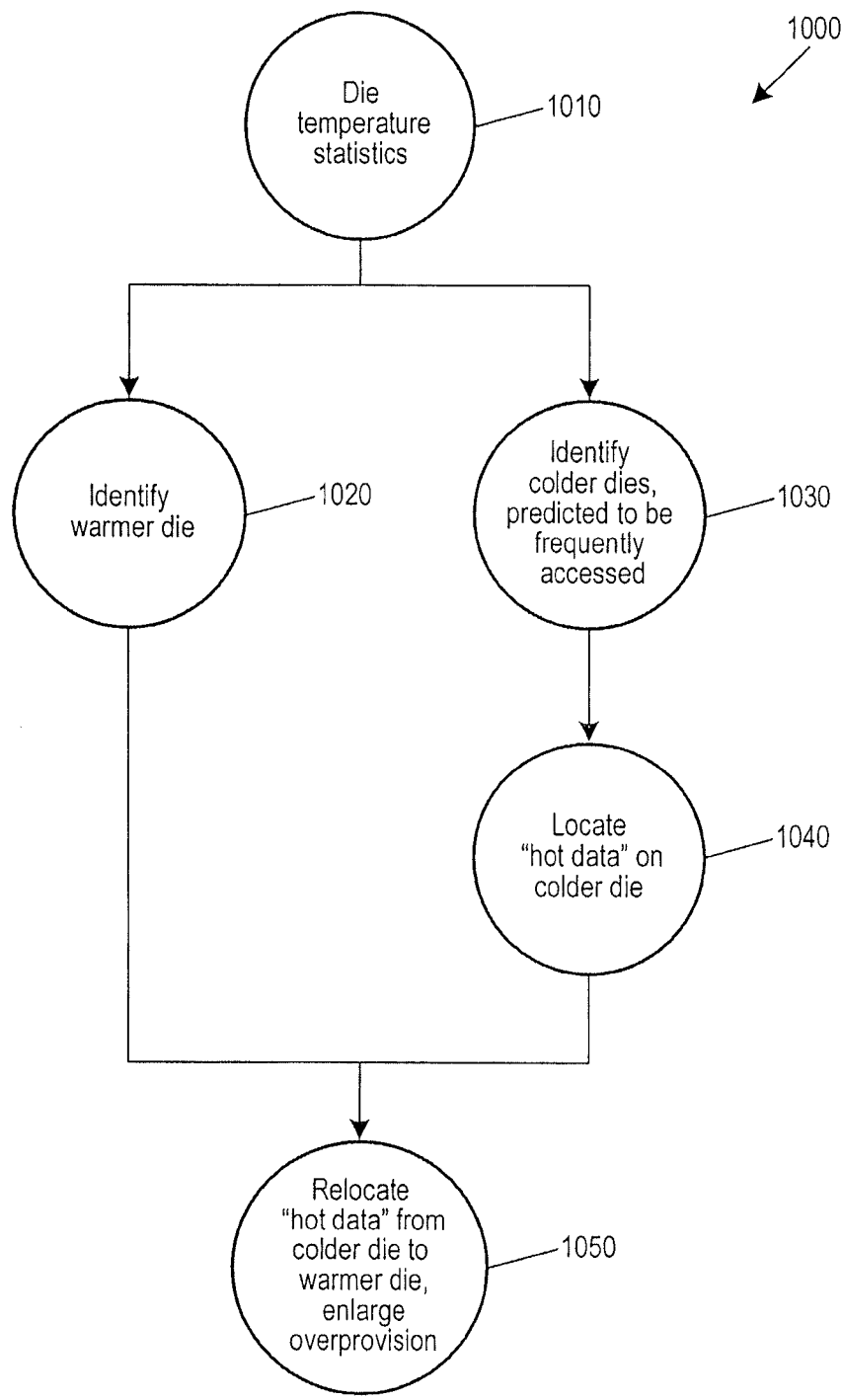
FIG. 10 is a flow chart of another method of an embodiment for temperature-based overprovisioning.

FIG. 10 is a flow chart 100 of another method of an embodiment for temperature-based overprovisioning. This method can be used, for example, in situations where the memory die temperature builds up as a response to the memory die being located near a warm place (e.g., next to some host component (e.g., DRAM or a controller) in the memory system's printed circuit board or the host). As a result, the memory die is being less frequently accessed, and the wear pressure of the other memory dies needs to be relaxed. As shown in FIG. 10, based on die temperature statistics (act 1010), the controller 102 identifies a warmer die (act 1020) and colder dies predicted to be frequently accessed (act 1030). The controller 102 then locates hot data on the colder die (act 1040) and relocates the hot data from the colder die to the warmer die, thereby enlarging the overprovision in the colder die (act 1050).

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for selecting memory dies for performing memory access operations in based on memory die temperatures, the method comprising:
    performing the following in a memory system comprising a plurality of memory dies, each memory die having its own temperature sensor:
        monitoring temperatures of the memory dies sensed by the temperature sensors;
        selecting which memory dies to perform memory access operations in based on the temperatures of the memory dies; and
        performing memory access operations in the selected memory dies.

2. The method of claim 1, wherein the selected memory dies are those memory dies that have not reached a maximum temperature limit.

3. The method of claim 1, wherein each memory die is assigned a weight based on the temperature of the memory die, and wherein the memory dies are selected based on the assigned weights.

4. The method of claim 1, wherein the memory dies are selected based on an average temperature of each memory die over time.

5. The method of claim 1, wherein, in addition to the temperatures of the memory dies, one or more of the following considerations are used in selecting the memory dies: performance considerations, wear leveling considerations, and memory die availability.

6. The method of claim 1 further comprising:
    relocating frequently-accessed data from a relatively-warmer memory die to a relatively-colder memory die; and
    relocating infrequently-accessed data from the relatively-colder memory die to the relatively-warmer memory die.

7. The method of claim 1 further comprising:
    enlarging overprovisioning of a relatively-warmer memory die by relocating frequently-accessed data from the relatively-warmer memory die to a relatively-colder memory die without relocating data from the relatively-colder memory die to the relatively-warmer memory die.

8. The method of claim 1 further comprising:
    enlarging overprovisioning of a relatively-colder memory die by relocating frequently-accessed data from the relatively-colder memory die to a relatively-warmer memory die without relocating data from the relatively-warmer memory die to the relatively-colder memory die.

9. The method of claim 1, wherein at least one memory die has a built-in temperature sensor.

10. The method of claim 1, wherein at least one memory die has an external temperature sensor.

11. The method of claim 1, wherein the memory access operations comprise write operations.

12. The method of claim 1, wherein the memory access operations comprise read operations.

13. The method of claim 1, wherein the memory access operations comprise write and read operations.

14. The method of claim 1, wherein at least one memory die is a three-dimensional memory.

15. A memory system comprising:
    a plurality of memory dies, each memory die having its own temperature sensor; and
    a controller in communication with the plurality of memory dies, wherein the controller is configured to:
        detect temperatures of the memory dies sensed by the temperature sensors;
        select which memory dies to thermal throttle memory access operations in based on the detected temperatures; and
        thermal throttle memory access operations only in the selected memory dies;
    wherein each memory die is assigned a weight based on the temperature of the memory die, and wherein the controller is further configured to select the memory dies by comparing the assigned weights to a threshold temperature.

16. The memory system of claim 15, wherein the selected memory dies are those memory dies that have reached a maximum temperature limit.

17. The memory system of claim 15, wherein the controller is further configured to select the memory dies by comparing an average temperature of each memory die over time to a threshold temperature.

18. The memory system of claim 15, wherein in selecting the memory dies, the controller is further configured to consider one or more of the following: performance considerations, wear leveling considerations, and memory die availability.

19. The memory system of claim 15, wherein the controller is further configured to:
relocate frequently-accessed data from a relatively-warmer memory die to a relatively-colder memory die; and
relocate infrequently-accessed data from the relatively-colder memory die to the relatively-warmer memory die.

20. The memory system of claim 15, wherein the controller is further configured to:
enlarge overprovisioning of a relatively-warmer memory die by relocating frequently-accessed data from the relatively-warmer memory die to a relatively-colder memory die without relocating data from the relatively-colder memory die to the relatively-warmer memory die.

21. The memory system of claim 15, wherein the controller is further configured to:
enlarge overprovisioning of a relatively-colder memory die by relocating frequently-accessed data from the relatively-colder memory die to a relatively-warmer memory die without relocating data from the relatively-warmer memory die to the relatively-colder memory die.

22. The memory system of claim 15, wherein at least one memory die has a built-in temperature sensor.

23. The memory system of claim 15, wherein at least one memory die has an external temperature sensor.

24. The memory system of claim 15, wherein the memory access operations comprise write operations.

25. The memory system of claim 15, wherein the memory access operations comprise read operations.

26. The memory system of claim 15, wherein the memory access operations comprise write and read operations.

27. The memory system of claim 15, wherein at least one memory die is a three-dimensional memory.

28. A memory system comprising:
a plurality of memory dies, each memory die having its own temperature sensor; and
a temperature-aware media management layer module in communication with the plurality of memory dies, wherein the temperature-aware media management layer module is configured to:
receive temperature information from the temperature sensors of the plurality of memory dies; and
route a memory access operation from a first memory die to a second memory die based on the received temperatures;
wherein each memory die is assigned a weight based on the temperature of the memory die, and wherein the temperature-aware media management layer module is configured to route the memory access operation based on the assigned weights of the first and second memory dies.

29. The memory system of claim 28, wherein the temperature-aware media management layer module is configured to route the memory access operation in response to the first memory die reaching a maximum temperature limit.

30. The memory system of claim 28, wherein the temperature-aware media management layer module is configured to route the memory access operation based on an average temperature of the first and second memory dies over time.

31. The memory system of claim 28, wherein, in addition to the temperatures of the memory dies, the temperature-aware media management layer module is configured to route the memory access operation based on one or more of the following considerations: performance considerations, wear leveling considerations, and memory die availability.

32. The memory system of claim 28, wherein the temperature-aware media management layer module is further configured to:
relocate frequently-accessed data from a relatively-warmer memory die to a relatively-colder memory die; and
relocate infrequently-accessed data from the relatively-colder memory die to the relatively-warmer memory die.

33. The memory system of claim 28, wherein the temperature-aware media management layer module is further configured to:
enlarge overprovisioning of a relatively-warmer memory die by relocating frequently-accessed data from the relatively-warmer memory die to a relatively-colder memory die without relocating data from the relatively-colder memory die to the relatively-warmer memory die.

34. The memory system of claim 28, wherein the temperature-aware media management layer module is further configured to:
enlarge overprovisioning of a relatively-colder memory die by relocating frequently-accessed data from the relatively-colder memory die to a relatively-warmer memory die without relocating data from the relatively-warmer memory die to the relatively-colder memory die.

35. The memory system of claim 28, wherein at least one memory die has a built-in temperature sensor.

36. The memory system of claim 28, wherein at least one memory die has an external temperature sensor.

37. The memory system of claim 28, wherein the memory access operation comprises a write operation.

38. The memory system of claim 28, wherein the memory access operation comprises a read operation.

39. The memory system of claim 28, wherein at least one memory die is a three-dimensional memory.

* * * * *